(12) United States Patent
Kaneko

(10) Patent No.: US 10,072,977 B2
(45) Date of Patent: Sep. 11, 2018

(54) OPTICAL MODULE WITH CAPACITOR AND DIGITAL COHERENT RECEIVER USING THE SAME

(71) Applicant: NEC CORPORATION, Tokyo (JP)

(72) Inventor: Taro Kaneko, Tokyo (JP)

(73) Assignee: NEC CORPORATION, Tokyo (JP)

( * ) Notice: Subject to any disclaimer, the term of this patent is extended or adjusted under 35 U.S.C. 154(b) by 36 days.

(21) Appl. No.: 15/121,402

(22) PCT Filed: Feb. 10, 2015

(86) PCT No.: PCT/JP2015/000605
§ 371 (c)(1),
(2) Date: Aug. 25, 2016

(87) PCT Pub. No.: WO2015/129178
PCT Pub. Date: Sep. 3, 2015

(65) Prior Publication Data
US 2016/0363480 A1    Dec. 15, 2016

(30) Foreign Application Priority Data
Feb. 26, 2014  (JP) .................................. 2014-035283

(51) Int. Cl.
*H01L 31/0203*  (2014.01)
*G02B 6/42*  (2006.01)
(Continued)

(52) U.S. Cl.
CPC .................. *G01J 1/46* (2013.01); *G02B 6/32* (2013.01); *G02B 6/42* (2013.01); *G02B 6/4206* (2013.01);
(Continued)

(58) Field of Classification Search
CPC ............. H01L 31/0203; H01L 31/0232; H01L 31/02005; H01L 31/02019; G02B 6/42;
(Continued)

(56) References Cited

U.S. PATENT DOCUMENTS 4,465,352 A * 8/1984 Hirobe .................... G02B 7/38
396/104
2004/0173877 A1  9/2004 Takase
(Continued)

FOREIGN PATENT DOCUMENTS

CN          2549481 Y    5/2003
CN          1527407 A    9/2004
(Continued)

OTHER PUBLICATIONS

Communication dated Apr. 1, 2017, from the State Intellectual Property Office of the P.R.C., in counterpart Chinese application No. 201580010819.9.
(Continued)

*Primary Examiner* — Que T Le
(74) *Attorney, Agent, or Firm* — Sughrue Mion, PLLC

(57) ABSTRACT

To shorten the length of an electric wiring between a capacitor and a PD, and to improve high frequency characteristics. An optical module of the present invention includes a light receiving element disposed at such a position that light from an optical transmission path is received on a light receiving surface in a state that the light receiving surface faces the optical transmission path; a spacer jointed to the optical transmission path and to the light receiving element in such a manner that a gap between the optical transmission path and the light receiving element is kept at a predetermined distance that light from the optical transmission path is allowed to enter the light receiving surface; and a capacitor electrically connected to the light receiving element, and
(Continued)

disposed along with the light receiving element on a surface of the spacer on the same side as that joined to the light receiving element.

10 Claims, 9 Drawing Sheets

(51) Int. Cl.
    *G01J 1/46*     (2006.01)
    *H01L 31/0232*     (2014.01)
    *H01L 31/02*     (2006.01)
    *G02B 6/32*     (2006.01)

(52) U.S. Cl.
    CPC .... *H01L 31/0203* (2013.01); *H01L 31/02005* (2013.01); *H01L 31/02019* (2013.01); *H01L 31/0232* (2013.01); *H01L 31/02325* (2013.01); *H01L 2224/48091* (2013.01); *H01L 2224/48111* (2013.01); *H01L 2224/48195* (2013.01)

(58) Field of Classification Search
    CPC .......... G02B 6/32; G01J 1/46; H01S 5/02248; H01S 5/02252
    USPC .............................................. 250/551, 214 R
    See application file for complete search history.

(56) References Cited

U.S. PATENT DOCUMENTS

| | | |
|---|---|---|
| 2006/0018608 A1 | 1/2006 | Mizoguchi |
| 2007/0036491 A1 | 2/2007 | Suzuki et al. |
| 2008/0036103 A1 | 2/2008 | Ban et al. |
| 2008/0298817 A1 | 12/2008 | Matsuo |
| 2013/0071129 A1 | 3/2013 | Yoneda et al. |

FOREIGN PATENT DOCUMENTS

| | | |
|---|---|---|
| CN | 1728364 A | 2/2006 |
| CN | 1860393 A | 11/2006 |
| CN | 1936638 A | 3/2007 |
| CN | 102124387 A | 7/2011 |
| JP | 2-79639 U | 6/1990 |
| JP | 5-158096 A | 6/1993 |
| JP | 5-196843 A | 8/1993 |
| JP | 2001-44552 A | 2/2001 |
| JP | 2006-41083 A | 2/2006 |
| JP | 2007-300032 A | 11/2007 |
| JP | 2008-40318 A | 2/2008 |
| JP | 2013-38216 A | 2/2013 |
| JP | 2013-65714 A | 4/2013 |

OTHER PUBLICATIONS

International Search Report for PCT/JP2015/000605 dated Apr. 28, 2015.
Written Opinion for PCT/JP2015/000605 dated Apr. 28, 2015.
Communication dated Apr. 1, 2017, from State Intellectual Property Office of the P.R.C. in counterpart application No. 201580010819.9.
Communication dated Dec. 13, 2017, from State Intellectual Property Office of the P.R.C. in counterpart application No. 201580010819.9.

* cited by examiner

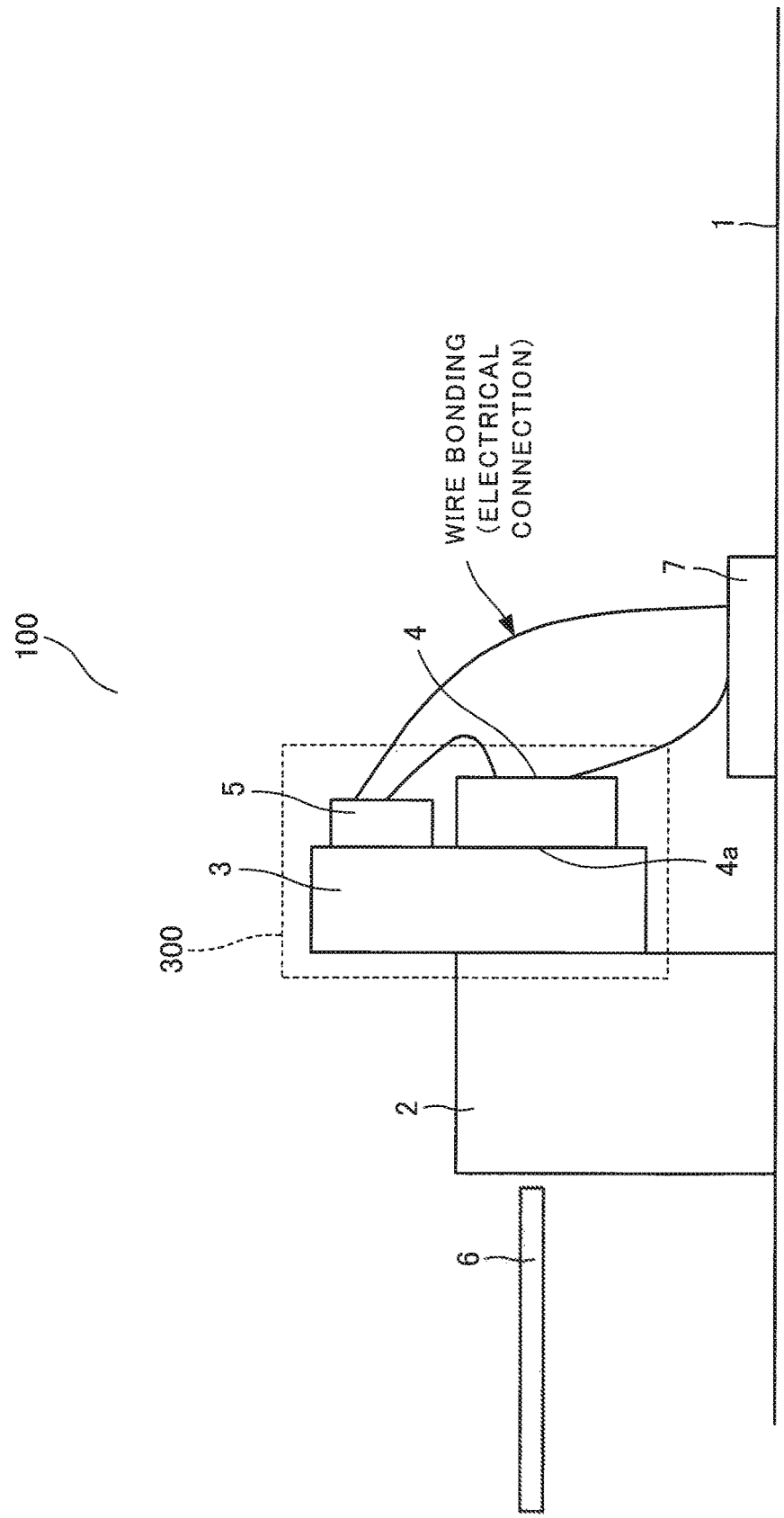

SIDE VIEW OF OPTICAL MODULE 100

PLAN VIEW OF SPACER 3

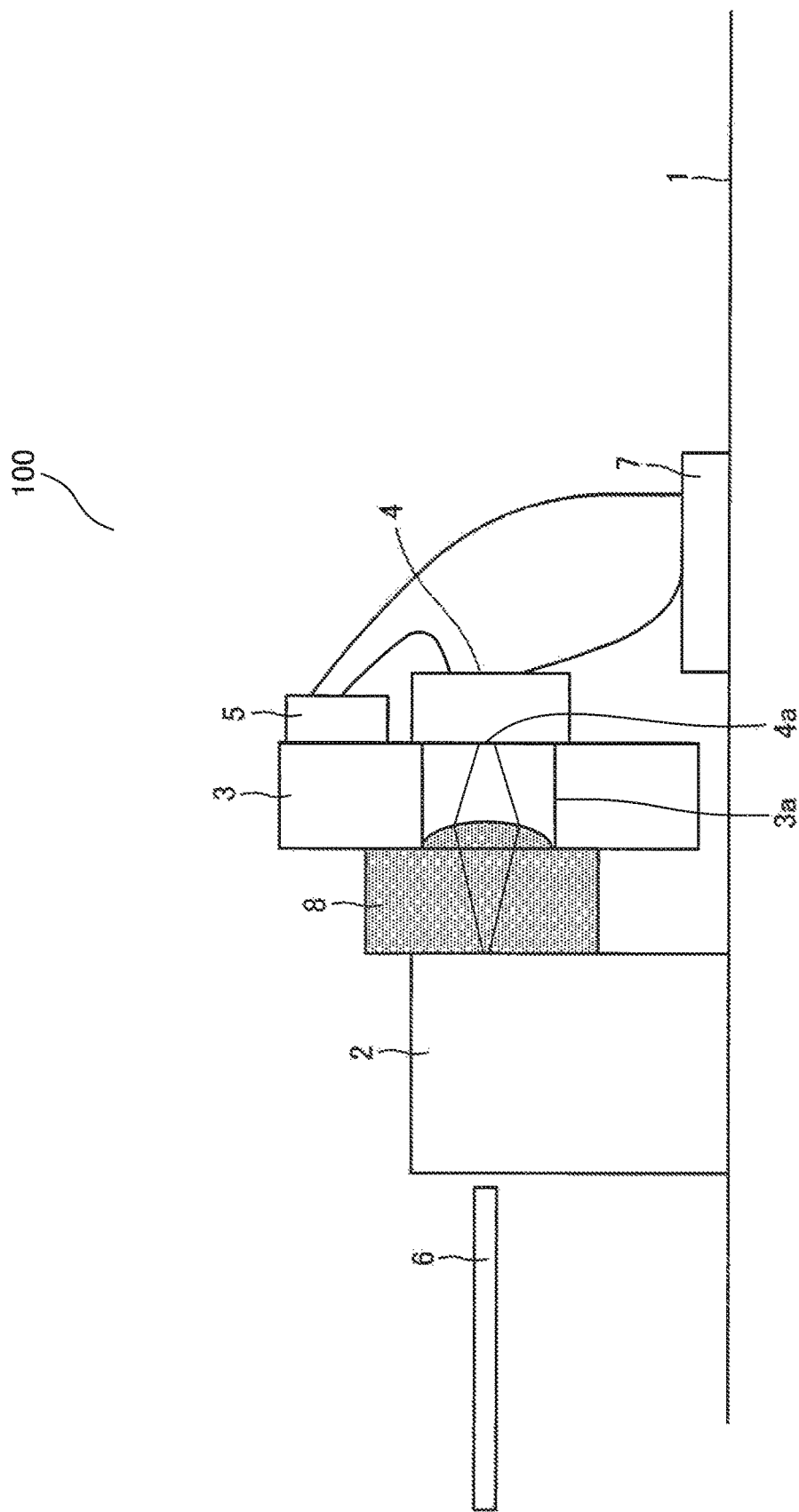

SIDE VIEW OF OPTICAL MODULE 200

PLAN VIEW OF SPACER 3

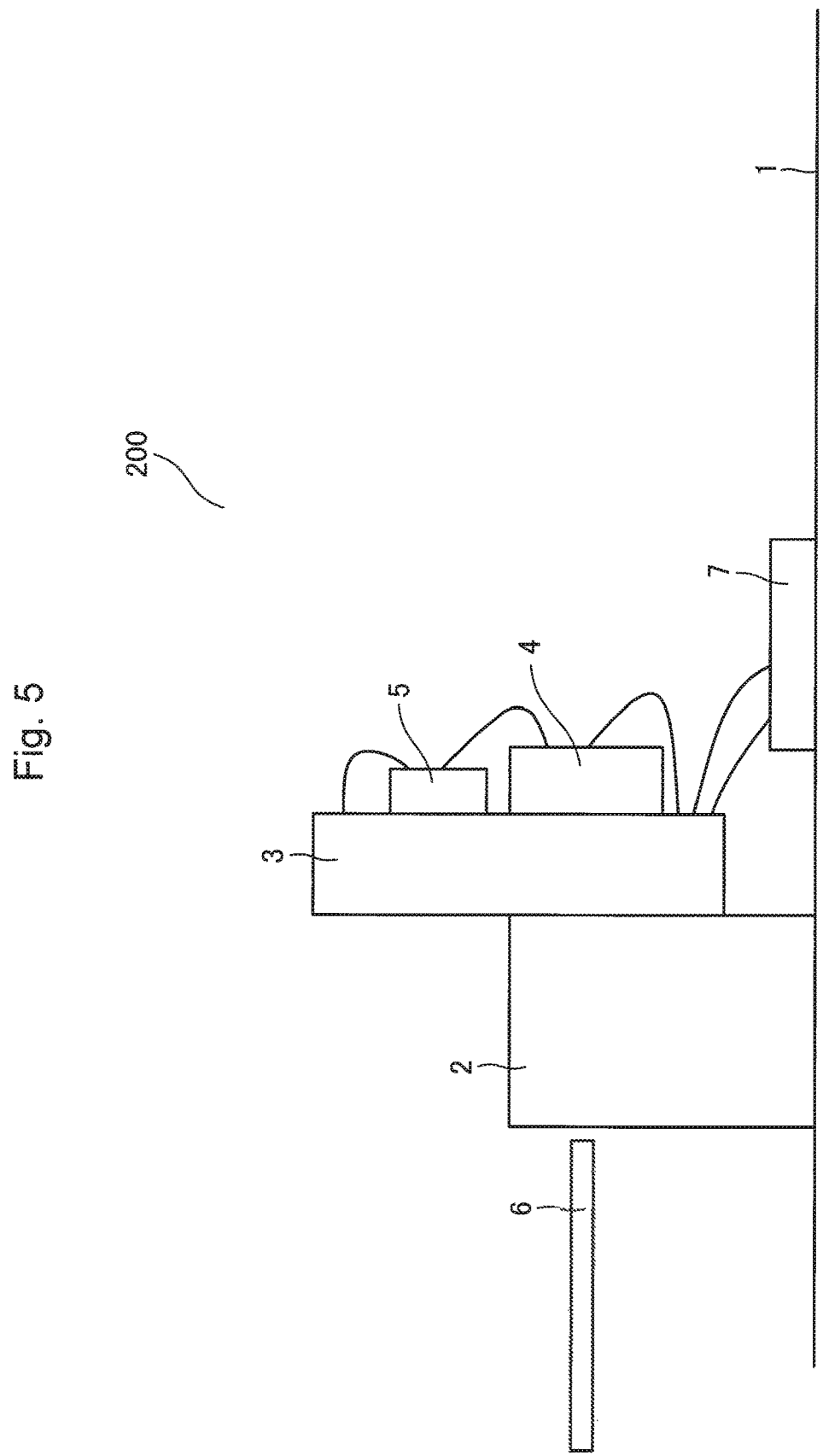

PLAN VIEW OF SPACER 3

PLAN VIEW OF SPACER 3

OPTICAL MODULE WITH CAPACITOR AND DIGITAL COHERENT RECEIVER USING THE SAME

CROSS REFERENCE TO RELATED APPLICATIONS

This application is a National Stage of International Application No. PCT/JP2015/000605 filed Feb. 10, 2015, claiming priority based on Japanese Patent Application No. 2014-035283 filed Feb. 26, 2014, the contents of all of which are incorporated herein by reference in their entirety.

TECHNICAL FIELD

The present invention relates to an optical module and a digital coherent receiver, and more particularly to an optical module and a digital coherent receiver which output an optical signal by photoelectric conversion.

BACKGROUND ART

In recent years, as large-capacity optical communication develops, introduction of a digital coherent system capable of expanding the capacity by phase interference progresses. The digital coherent system is a technique, in which a high-speed optical signal is converted by photoelectric conversion with a light receiving element, and is processed in a high-speed digital circuit for compensating an influence caused by dispersion or the like so as to implement long-distance and large-capacity transmission.

In a digital coherent system, a high-speed signal of 100 Gbps is handled, which requires high-speed response performance for a light receiving element. As one of the measures for attaining high speed performance for a light receiving element, it is a general practice to dispose a bypass capacitor in the vicinity of a photodiode (PD) to stabilize the impedance in a high frequency operation. As a related art, PTL 1 describes an example, in which an avalanche photodiode (APD) and a bypass capacitor are electrically connected to each other on a circuit substrate.

Further, as illustrated in FIG. 9, a digital coherent receiver is internally provided with, for instance, an optical fiber, a mixer, a PD, a lens, a capacitor, and a transimpedance amplifier (TIA). A mixer of an optical waveguide type is mainly used as the mixer. In this configuration, generally, the light exit position is at a height of about 0.5 to 1 mm depending on the thickness of a substrate of an optical waveguide. Light incident on the digital coherent receiver is reflected on a reflection mirror at 90 degrees, and is received by the PD on a substrate. PTL 2 describes an example, in which an related optical system is constituted by a lens substrate provided with a mirror surface, and an optical element.

On the other hand, as an optical module is miniaturized by a trend in recent years, there is a demand for miniaturization of a component to be used in a digital coherent module as well. In particular, it is essential to miniaturize an optical system for use in a digital coherent receiver. In view of the above, it is possible to miniaturize the optical system by omitting the aforementioned reflection mirror and by optically and directly connecting a lens and a PD. As a technique related to an optical system part, PTL 3 discloses a receptacle for receiving an optical connector plug. In the invention of PTL 3, laser light emitted from a semiconductor laser is collected on a lens, and the collected light enters a transparent bottom portion through the back surface of the lens. Laser light transmitted through the bottom portion is incident into an optical fiber from an inner bottom surface of a blind hole.

CITATION LIST

Patent Literature

[PTL 1] Japanese Laid-open Utility Model Publication No. H2-79639
[PTL 2] Japanese Laid-open Patent Publication No. 2008-40318
[PTL 3] Japanese Laid-open Patent Publication No. H5-196843

SUMMARY OF INVENTION

Technical Problem

However, assuming that a lens and a PD are optically and directly connected to each other, the length of an electric wiring between a capacitor and the PD mounted on a substrate increases. This may cause a problem that high frequency characteristics deteriorate. An object of the present invention is to provide an optical module and a digital coherent receiver that enable to solve the aforementioned problems.

Solution to Problem

An optical module of the present invention includes a substrate; a light receiving element disposed at such a position that light from an optical transmission path is received on a light receiving surface in a state that the light receiving surface faces the optical transmission path; a spacer jointed to the optical transmission path and to the light receiving element in such a manner that a gap between the optical transmission path and the light receiving element is kept at a predetermined distance that light from the optical transmission path is allowed to enter the light receiving surface; and a capacitor electrically connected to the light receiving element, and disposed along with the light receiving element on a surface of the spacer on the same side as that joined to the light receiving element.

A digital coherent receiver of the present invention includes the optical module.

Advantageous Effects of Invention

It is possible to shorten the length of an electric wiring between a light receiving element and a capacitor, and to improve high frequency characteristics.

BRIEF DESCRIPTION OF DRAWINGS

FIG. 1 is a side view of an optical module 100 in a first exemplary embodiment of the present invention;
FIG. 3 is a side view of the optical module 100 in the first exemplary embodiment of the present invention.

FIG. 5 is a side view of the optical module 200 in the second exemplary embodiment of the present invention;

DESCRIPTION OF EMBODIMENTS

Figure 2A:
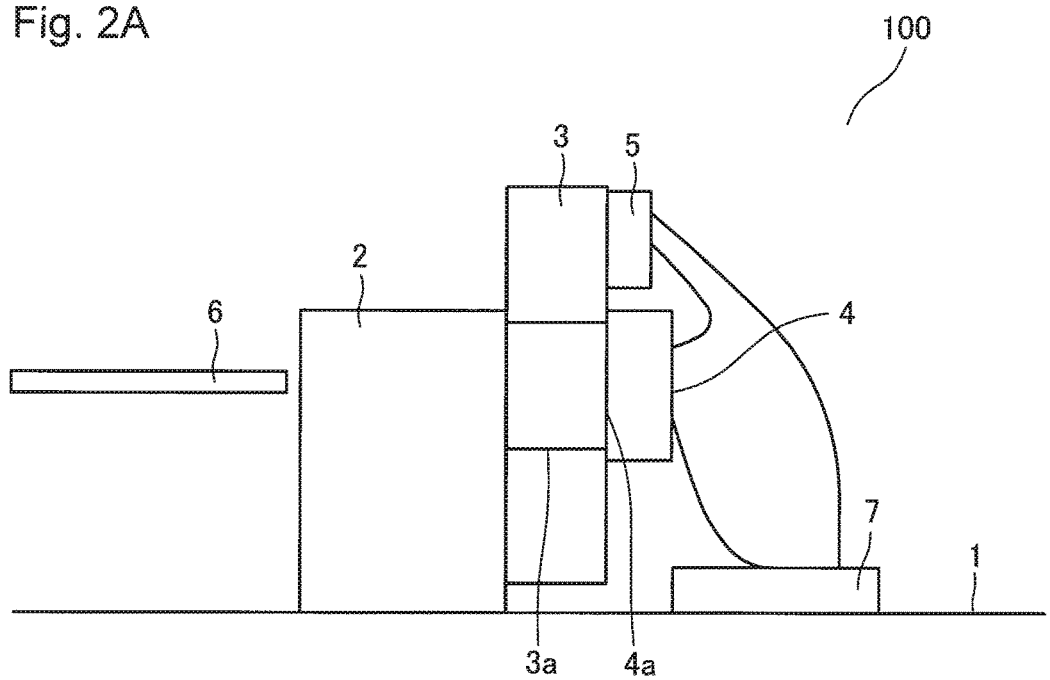
FIG. 2A is a side view of the optical module 100 in the first exemplary embodiment of the present invention.

In the following, preferred exemplary embodiments for implementing the present invention are described in details referring to the drawings. Note that the exemplary embodiments to be described below include technically preferred limitations, but do not limit the scope of the present invention as described below.

First Exemplary Embodiment

FIG. 1 is a side view of an optical module 100 in the first exemplary embodiment. As illustrated in FIG. 1, the optical module 100 in the first exemplary embodiment includes a light receiving element 4 and a capacitor 5. The light receiving element 4 is disposed at such a position that light from an optical transmission path 6 is received on a light receiving surface 4a in a state that the light receiving surface 4a faces the optical transmission path 6. The capacitor 5 is electrically connected to the light receiving element 4, and is disposed along with the light receiving element 4. According to this configuration, the length of an electric wiring between the light receiving element 4 and the capacitor 5 is shortened. This improves high frequency characteristics.

Note that as described above, in the optical module 100 of the exemplary embodiment, the light receiving element 4 and the capacitor 5 are disposed side by side. This makes it possible to shorten the length of an electric wiring between the light receiving element 4 and the capacitor 5, and to improve high frequency characteristics. The optical module 100 may further include an optical element 2 and a spacer 3, in addition to the light receiving element 4 and the capacitor 5. The optical element 2 receives light from the optical transmission path 6. The spacer 3 is joined to the optical element 2 and to the light receiving element 4 in such a manner that a gap between the optical element 2 and the light receiving element 4 is kept at a predetermined distance that light from the optical element 2 is allowed to enter the light receiving surface 4a.

Further, the optical module 100 includes an external circuit 7. The external circuit 7 is capable of electrically connecting the light receiving element 4 and the capacitor 5 to each other. FIG. 1 to FIG. 3 illustrate a case in which the external circuit 7 is mounted on a substrate 1.

Figure 2B:
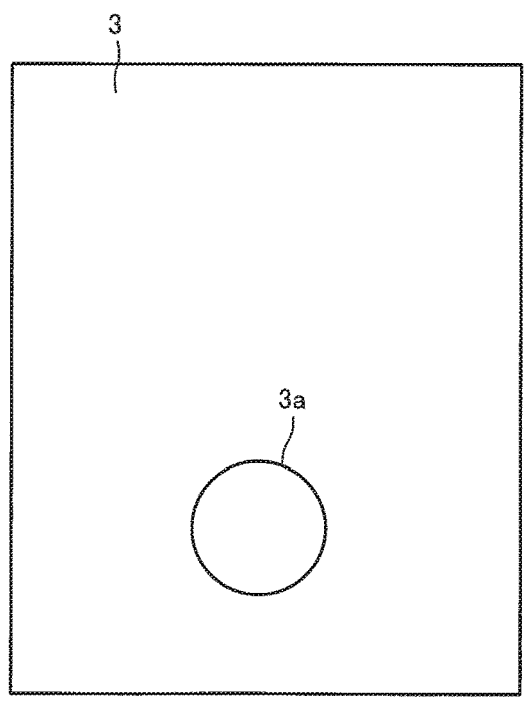
FIG. 2B is a front view of a spacer 3 in the first exemplary embodiment of the present invention.

As illustrated in FIG. 2A and FIG. 2B, the spacer 3 may include a through-hole 3a between the optical element 2 and the light receiving surface 4a. In this configuration, it is possible to use a light non-transmission material as the spacer 3.

FIG. 3 illustrates an example, in which the optical module 100 further includes a lens 8 between the optical element 2 and the spacer 3. In this configuration, the light receiving element 4 is disposed at such a position that light from the lens 8 is received on the light receiving surface 4a in a state that the light receiving surface 4a faces the lens 8.

The spacer 3 is disposed between the lens 8 and the light receiving element 4 in such a manner that the light receiving surface 4a is located at a position corresponding to the focal length of the lens 8. The spacer 3 is joined to the lens 8 and to the light receiving element 4.

Any of FIG. 1 to FIG. 3 illustrates an example, in which, with respect to at least one of combinations between the light receiving element 4 and the capacitor 5, between the light receiving element 4 and the external circuit 7, and between the capacitor 5 and the external circuit 7, the components in the combination are electrically connected by wire bonding. Alternatively, the components may be electrically connected by another method.

[Description on Operation]

Next, an operation of the optical module 100 in the exemplary embodiment is described. As illustrated in FIG. 1, light from the optical transmission path 6 is received by the optical element 2. The light receiving element 4 is disposed at such a position that the optical element 2 and the light receiving surface 4a face to each other, and receives light from the optical element 2. In this configuration, the gap between the optical element 2 and the light receiving element 4 is kept at a predetermined distance that light from the optical element 2 is allowed to enter the light receiving surface 4a by the spacer 3 joined to the optical element 2 and to the light receiving element 4. As illustrated in FIG. 3, when the optical module 100 further includes the lens 8 between the optical element 2 and the spacer 3, the light receiving element 4 receives light from the lens 8 on the light receiving surface in a state that the light receiving surface faces the lens 8. In this configuration, the spacer 3 is disposed between the lens 8 and the light receiving element 4 in such a manner that the light receiving surface 4a is located at a position corresponding to the focal length of the lens 8. The lens 8 and the light receiving element 4 are joined by the spacer 3. In the configuration of the spacer 3 illustrated in FIG. 1, light is transmitted through the spacer 3, and the transmitted light is received by the light receiving element 4. In the configuration of the spacer 3 illustrated in FIG. 2 and FIG. 3, in which the through-hole 3a is formed between the optical element 2 and the light receiving surface 4a, light is transmitted through the through-hole 3a, and the transmitted light is received by the light receiving element 4.

The capacitor 5 is electrically connected to the light receiving element 4, and is disposed along with the light receiving element 4 on a surface of the spacer 3 on the same side as that jointed to the light receiving element 4. Therefore, it is possible to shorten the length of an electric wiring between the light receiving element 4 and the capacitor 5. This improves high frequency characteristics. Further, shortening the length of an electric wiring between the light receiving element 4 and the capacitor 5 makes it possible to lower the impedance of the wiring. This makes it possible to stabilize a high frequency operation of the light receiving element 4. If the length of an electric wiring between the light receiving element 4 and the capacitor 5 increases, the impedance of the wiring rises, and for instance, the light receiving element 4 may resonate with the capacitor 5. This may make it difficult to efficiently remove AC noise by the capacitor 5. On the other hand, as described above, in the exemplary embodiment, by shortening the length of an electric wiring between the light receiving element 4 and the capacitor 5, the impedance of the wiring is lowered. This makes it possible to efficiently remove AC noise by the capacitor 5. Thus, in the exemplary embodiment, since AC noise decreases, a high frequency operation of the light receiving element 4 is stabilized. As illustrated in FIG. 1 to FIG. 3, an electrical signal obtained by photoelectric conversion by the light receiving element 4 is output to the external circuit 7. The capacitor 5 is also connected to the external circuit 7, as necessary.

The optical element 2 and the spacer 3, the lens 8 and the spacer 3, and the spacer 3 and the light receiving element 4 may be joined to each other by various joining methods such as adhesion using an adhesive agent.

Second Exemplary Embodiment

Figure 4A:
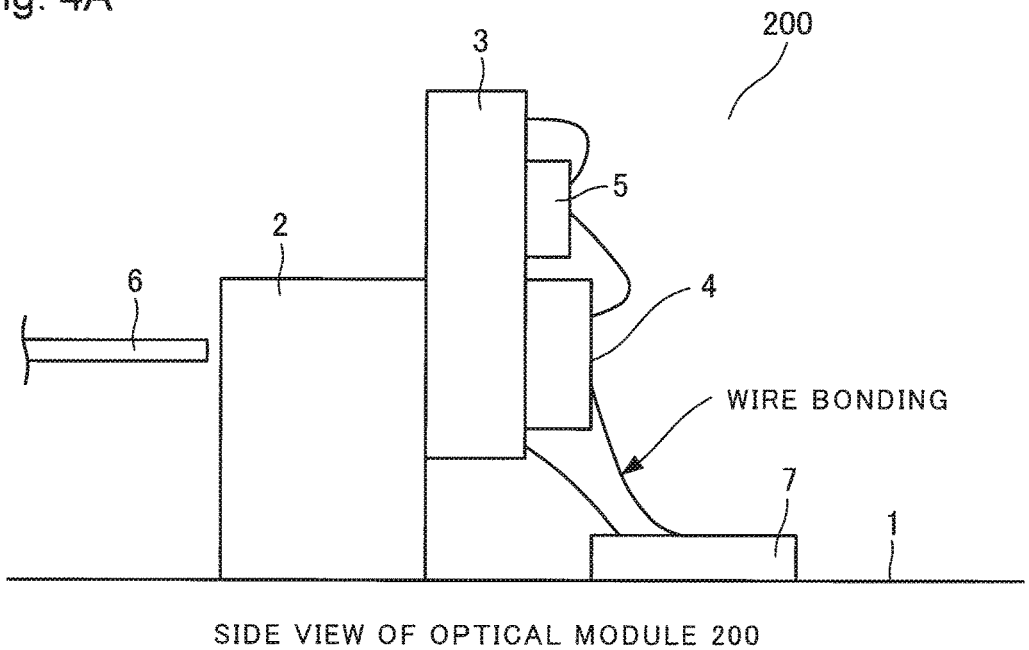
FIG. 4A is a side view of an optical module 200 in a second exemplary embodiment of the present invention.
Figure 4B:
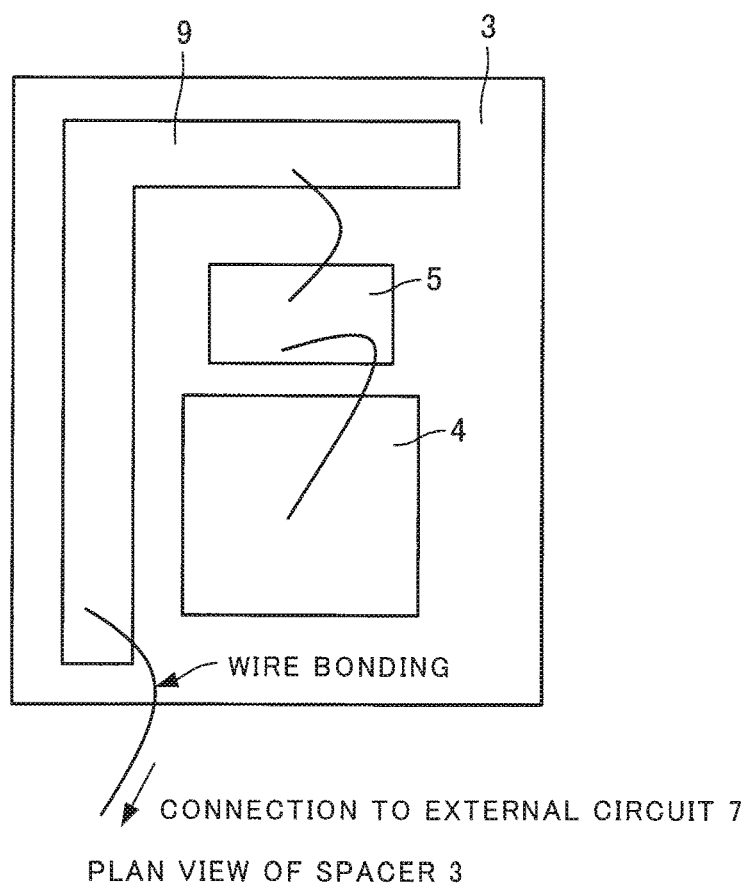
FIG. 4B is a front view of a spacer 3 in the second exemplary embodiment of the present invention.

Next, an optical module 200 in the second exemplary embodiment is described referring to FIG. 4. FIG. 4A is a side view of the optical module 200. FIG. 4B is a plan view of a spacer 3. Note that FIG. 4B is a diagram illustrating an example after a light receiving element 4 and a capacitor 5 are disposed side by side on a same surface of the spacer 3. As illustrated in FIG. 4B, the optical module 200 in the exemplary embodiment is different from the first exemplary embodiment in a point that the spacer 3 further includes an electric wiring 9. A substrate 1, an optical element 2, the spacer 3, the light receiving element 4, and the capacitor 5 are the same as those in the first exemplary embodiment.

As illustrated by the example in FIG. 4B, the spacer 3 includes the electric wiring 9 connectable to an external circuit 7. The wiring pattern of the electric wiring 9 on the spacer 3 is not limited to the example. FIG. 4A illustrates an example, in which the capacitor 5 is connected to the electric wiring 9. In other words, the capacitor 5 is electrically connected to the external circuit 7 via the electric wiring 9. Further, as illustrated in FIG. 4A, electrical connection between the light receiving element 4 and the capacitor 5, and between the light receiving element 4 and the external circuit 7 is performed by wire bonding. Alternatively, the light receiving element 4 may not be connected to the capacitor 5, but may be connected to the electric wiring 9. Further, as illustrated in FIG. 5, each of the light receiving element 4 and the capacitor 5 may be connected to the electric wiring 9. In addition to the above, the electric wiring 9 may be used, as necessary, for electrical connection between the light receiving element 4 and the capacitor 5, between the capacitor 5 and the external circuit 7, and between the light receiving element 4 and the external circuit 7.

Figure 6:
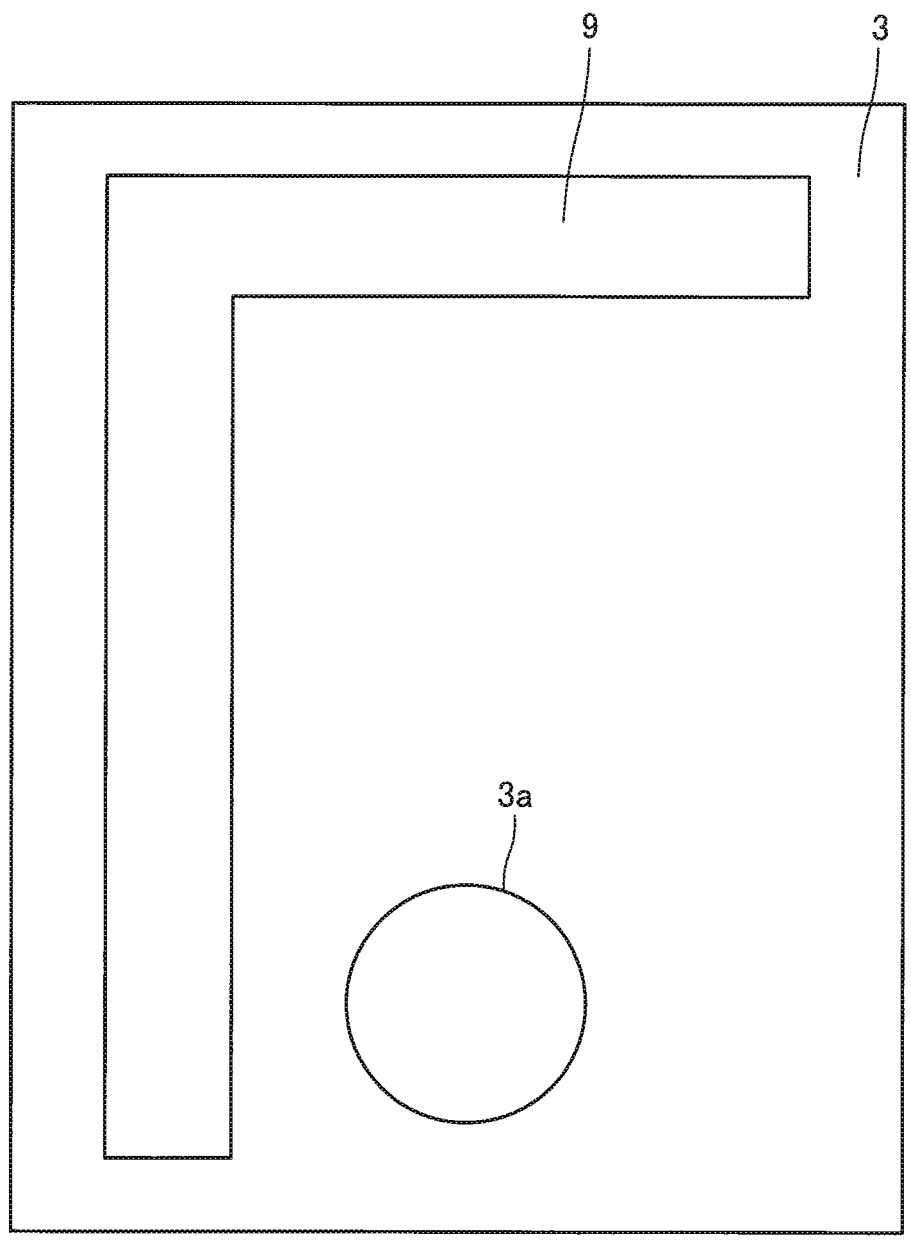
FIG. 6 is a front view of the spacer 3 in the second exemplary embodiment of the present invention.
Figure 7:
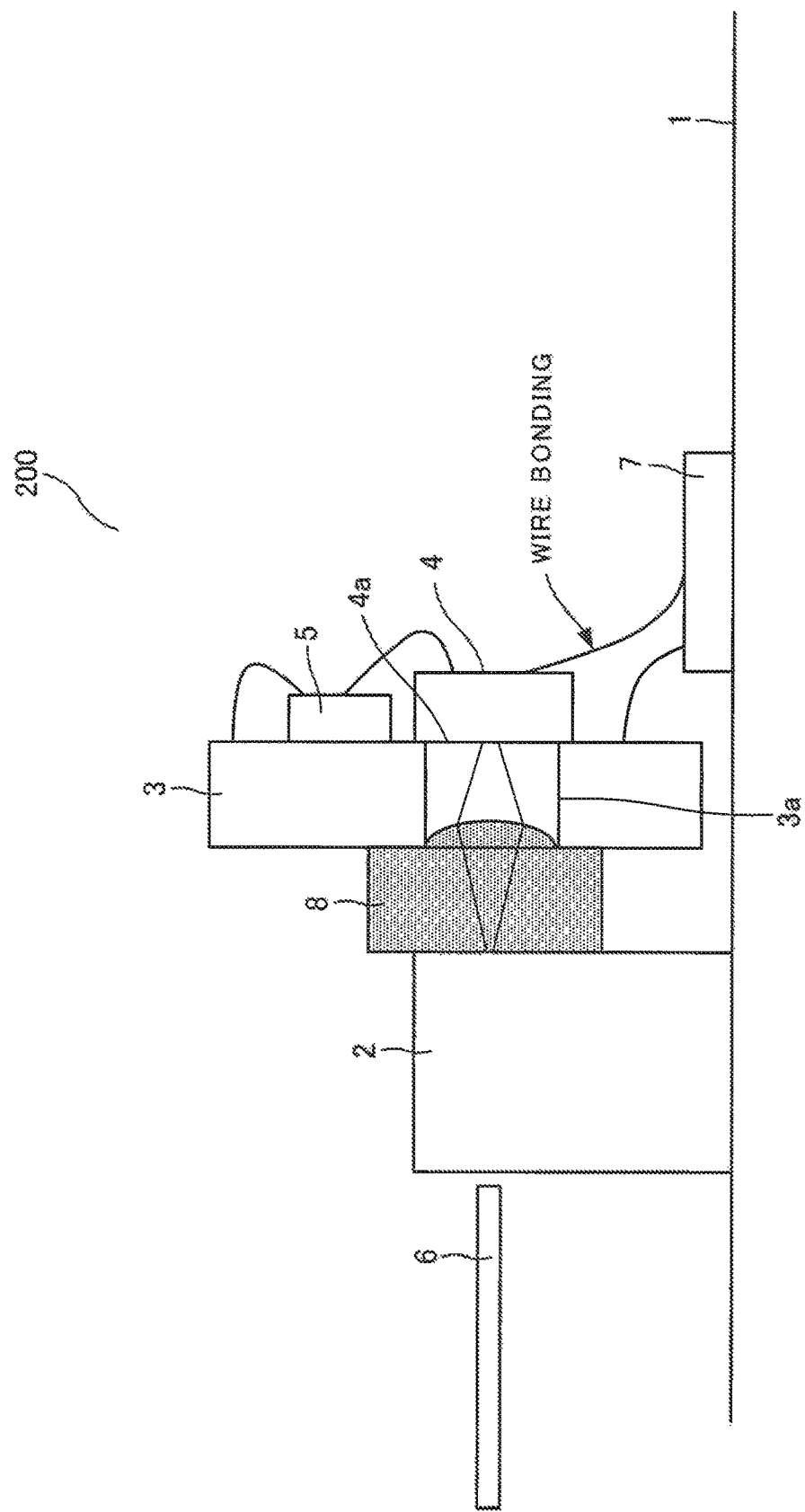
FIG. 7 is a side view of the optical module 200 in the second exemplary embodiment of the present invention.

Further, as illustrated in FIG. 6, also when the spacer 3 includes a through-hole 3a, the optical module 200 may further include the electric wiring 9. As illustrated in FIG. 7, the same configuration as described above is also applied to a configuration, in which the optical module 200 further includes a lens 8 between the optical element 2 and the light receiving element 4.

As described above, providing the spacer 3 with the electric wiring 9 connectable to the external circuit 7 makes it easy to manufacture an optical module, as compared with a configuration, in which all the electric connections are manually performed by wire bonding or the like. Further, it is easy to shorten the connection distance by wire bonding or the like. This is advantageous in reducing noise or inductance resulting from a redundant wire.

In addition to the above, it is possible to avoid a risk that entangling, disconnection and others may occur in a post process of manufacturing and mounting, because a wire portion such as a long wire is not formed.

Third Exemplary Embodiment

Figure 8:
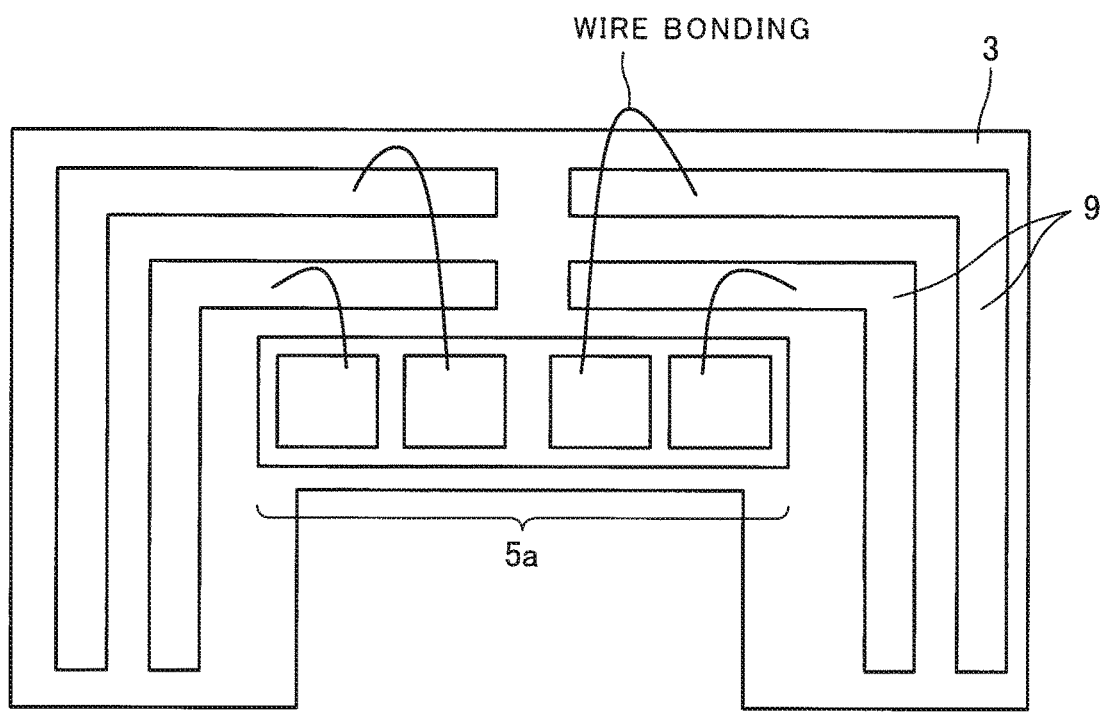
FIG. 8 is a diagram of a spacer 3 and a 4-unit array capacitor 5a in a third exemplary embodiment of the present invention.
Figure 9:
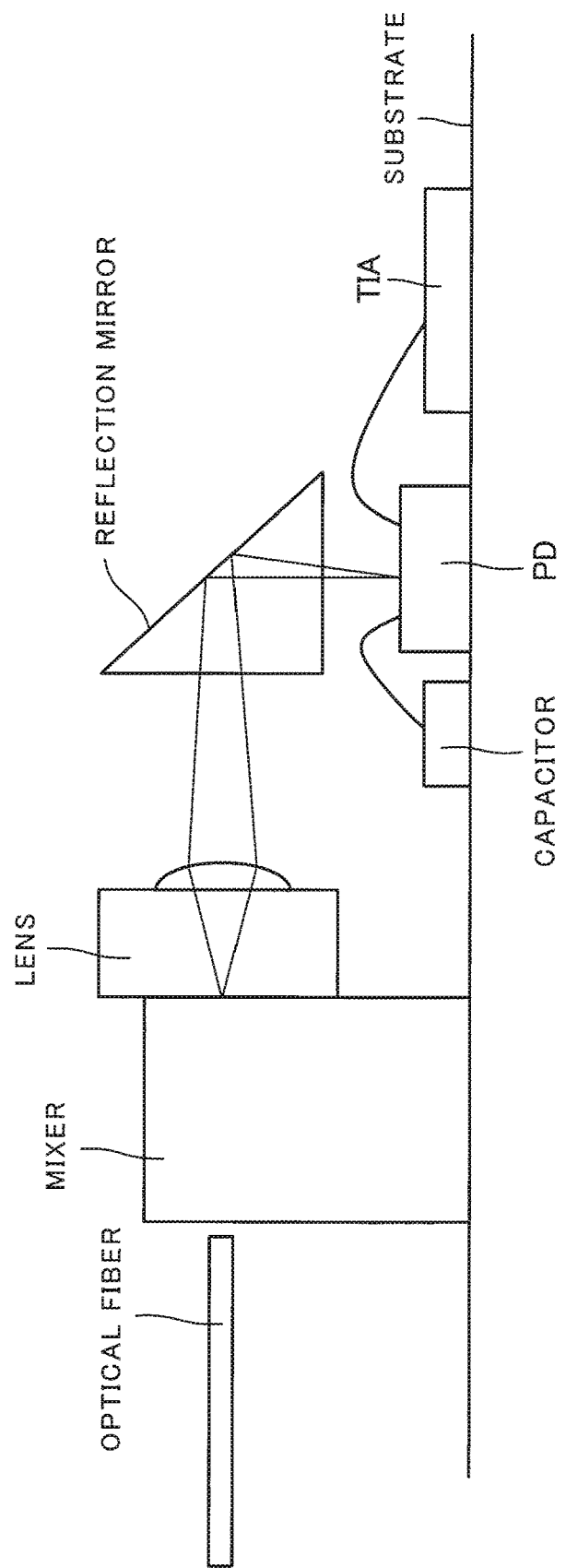
FIG. 9 is a diagram illustrating an example of an optical module to which the technique described in PTL 2 is applied.

Next, as the third exemplary embodiment, a configuration in which at least one of a light receiving element 4, a capacitor 5, and a lens 8 has an array structure that two or more channels are integrated is described referring to FIG. 8. The third exemplary embodiment exemplifies that a spacer 3 includes an electric wiring 9 connectable to the external circuit 7 described in the second exemplary embodiment. The same configuration as described above is also applicable to the spacer 3 in the first exemplary embodiment. The other constituent elements of the present invention are the same as those in the first and second exemplary embodiments.

The third exemplary embodiment describes an example, in which any of the light receiving element 4, the capacitor 5, and the lens 8 has a 4-unit array structure.

FIG. 8 illustrates a spacer 3 and a 4-unit array capacitor 5a among these constituent elements. As illustrated in FIG. 7, four light rays from an optical element 2 are respectively collected on individual lenses 8, pass through a through-hole 3a of the spacer 3, and are respectively received by individual light receiving elements 4. By the array structure as described above, it is possible to integrate many functions on a limited mounted area. It is needless to say that the number of units in an array is not limited to four. A two-dimensional array having two or more arrays may be formed.

In the following, variations of the present invention are exemplified. The lens 8 may be fixed to the optical element 2. Further, the optical element 2 may be preferably an optical waveguide. It is possible to implement miniaturization by applying an optical waveguide to the optical element 2. Preferably, the light receiving element 4 may be a PD. More preferably, the light receiving element 4 may be a back incident type PD. The back incident type PD has an enhanced high-speed response performance. Therefore, applying the back incident type PD to the light receiving element 4 is advantageous in high-speed communication such as digital coherent communication. An example of the external circuit 7 is TIA. Further, in all the exemplary embodiments, the capacitor 5 is located above the light receiving element 4. Alternatively, the capacitor 5 may be disposed below a light receiving element. For instance, when the height of the optical element 2 is high, a large space can be formed between the spacer 3 and the substrate 1. In view of the above, disposing the capacitor 5 below the light receiving element makes it possible to reduce the height of an optical module.

Further, the optical module 100 or 200 of the present invention is applicable to a digital coherent receiver.

Fourth Exemplary Embodiment

Next, an optical module 300 in the fourth exemplary embodiment is described referring to FIG. 1. Note that the optical module 300 of the exemplary embodiment includes, as a minimum configuration required for improving high frequency characteristics, a spacer 3, a light receiving element 4, and a capacitor 5. The light receiving element 4 is disposed at such a position that light from an optical transmission path is received on a light receiving surface in a state that the light receiving surface faces the optical transmission path. The spacer 3 is joined to the optical transmission path and to the light receiving element 4 in such a manner that a gap between the optical transmission path and the light receiving element is kept at a predetermined distance that light from the optical transmission path is allowed to enter the light receiving surface. The capacitor 5 is electrically connected to the light receiving element 4, and is disposed along with the light receiving element 4 on a surface of the spacer 3 on the same side as that joined to the light receiving element 4.

According to the aforementioned configuration, the length of an electric wiring between the light receiving element 4 and the capacitor 5 is shortened. This makes it possible to improve high frequency characteristics.

A part or all of the exemplary embodiments may also be described as the following Supplementary Notes. The present invention, however, is not limited to the following.

Supplementary Note 1

An optical module including:
a light receiving element disposed at such a position that light from an optical transmission path is received on a light receiving surface in a state that the light receiving surface faces the optical transmission path;
a spacer jointed to the optical transmission path and to the light receiving element in such a manner that a gap between the optical transmission path and the light receiving element is kept at a predetermined distance that light from the optical transmission path is allowed to enter the light receiving surface; and
a capacitor electrically connected to the light receiving element, and disposed along with the light receiving element on a surface of the spacer on the same side as that joined to the light receiving element.

Supplementary Note 2

The optical module according to Supplementary Note 1, wherein
the optical module includes
an optical element disposed on the substrate, and configured to receive light from the optical transmission path; and
the light receiving element disposed at such a position that light from the optical element is received on the light receiving surface in a state that the light receiving surface faces the optical element.

Supplementary Note 3

The optical module according to Supplementary Note 1 or 2, wherein
the spacer includes an electric wiring connectable to an external circuit.

Supplementary Note 4

The optical module according to Supplementary Note 3, wherein
the capacitor is connected to the electric wiring.

Supplementary Note 5

The optical module according to Supplementary Note 3 or 4, wherein
the light receiving element is connected to the electric wiring.

Supplementary Note 6

The optical module according to any one of Supplementary Notes 2 to 5, wherein
the spacer includes a through-hole between the optical element and the light receiving surface.

Supplementary Note 7

The optical module according to any one of Supplementary Notes 2 to 6, further including:
a lens between the optical element and the spacer, wherein
the light receiving element is disposed at such a position that light from the lens is received on the light receiving surface in a state that the light receiving surface faces the lens, and
the spacer is disposed between the lens and the light receiving element, and is joined to each of the lens and the light receiving element in such a manner that the light receiving surface is located at a position corresponding to a focal length of the lens.

Supplementary Note 8

The optical module according to any one of Supplementary Notes 1 to 7, wherein
at least one between the light receiving element and the capacitor, between the light receiving element and an external circuit, and between the capacitor and the external circuit is electrically connected by wire bonding.

Supplementary Note 9

The optical module according to any one of Supplementary Notes 1 to 8, wherein
at least one of the lens, the light receiving element, and the capacitor has an array structure, in which two or more channels are integrated.

Supplementary Note 10

The optical module according to any one of Supplementary Notes 1 to 11, wherein
any of the lens, the light receiving element, and the capacitor has a 4-unit array structure.

Supplementary Note 11

The optical module according to any one of Supplementary Notes 2 to 12, wherein
the optical element is fixed to the lens.

Supplementary Note 12

The optical module according to Supplementary Notes 2 to 10, wherein
the optical element is an optical waveguide, and
the light receiving element is a back incident type light receiving element.

Supplementary Note 13

A digital coherent receiver including the optical module according to any one of Supplementary Notes 1 to 12.

Note that the present invention is not limited by the aforementioned exemplary embodiments, but may be modified as necessary by a person skilled in the art as far as the modifications do not depart from the gist of the present invention.

The invention of the present application is described as above referring to the exemplary embodiments. The invention of the present application, however, is not limited by the aforementioned exemplary embodiments. The configuration and the details of the invention of the present application may be modified in various ways comprehensible to a person skilled in the art in the scope of the invention of the present application.

This application claims the priority based on Japanese Patent Application No. 2014-035283 filed on Feb. 26, 2014, and all of the disclosure of which is hereby incorporated.

REFERENCE SIGNS LIST

1 Substrate
2 Optical element
3 Spacer
3a Through-hole
4 Light receiving element
4a Light receiving surface
5 Capacitor
5a 4-unit array capacitor
6 Optical transmission path
7 External circuit
8 Lens
9 Electric wiring
100, 200 Optical module

The invention claimed is:

1. An optical module comprising:
a light receiving element disposed at such a position that light from an optical transmission path is received on a light receiving surface in a state that the light receiving surface faces the optical transmission path;
a spacer jointed to the optical transmission path and to the light receiving element in such a manner that a gap between the optical transmission path and the light receiving element is kept at a predetermined distance that light from the optical transmission path is allowed to enter the light receiving surface; and
a capacitor electrically connected to the light receiving element, and disposed along with the light receiving element on a surface of the spacer on the same side as that joined to the light receiving element.

2. The optical module according to claim 1, wherein the optical module includes
an optical element disposed on the spacer, and configured to receive light from the optical transmission path; and
the light receiving element disposed at such a position that light from the optical element is received on the light receiving surface in a state that the light receiving surface faces the optical element.

3. The optical module according to claim 1, wherein the spacer includes an electric wiring connectable to an external circuit.

4. The optical module according to claim 3, wherein the capacitor is connected to the electric wiring.

5. The optical module according to any one of claim 2, wherein
the spacer includes a through-hole between the optical element and the light receiving surface.

6. The optical module according to any one of claim 2, further comprising:
a lens between the optical element and the spacer, wherein
the light receiving element is disposed at such a position that light from the lens is received on the light receiving surface in a state that the light receiving surface faces the lens, and
the spacer is disposed between the lens and the light receiving element, and is joined to each of the lens and the light receiving element in such a manner that the light receiving surface is located at a position corresponding to a focal length of the lens.

7. The optical module according to any one of claim 1, wherein
at least one of between the light receiving element and the capacitor, between the light receiving element and an external circuit, and between the capacitor and the external circuit is electrically connected by wire bonding.

8. The optical module according to any one of claim 1, wherein
at least one of the lens, the light receiving element, and the capacitor has an array structure, in which two or more channels are integrated.

9. The optical module according to claim 2, wherein the optical element is an optical waveguide, and the light receiving element is a back incident type light receiving element.

10. A digital coherent receiver comprising an optical module including:
a light receiving element disposed at such a position that light from an optical transmission path is received on a light receiving surface in a state that the light receiving surface faces the optical transmission path;
a spacer jointed to the optical transmission path and to the light receiving element in such a manner that a gap between the optical transmission path and the light receiving element is kept at a predetermined distance that light from the optical transmission path is allowed to enter the light receiving surface; and
a capacitor electrically connected to the light receiving element, and disposed along with the light receiving element on a surface of the spacer on the same side as that joined to the light receiving element.

* * * * *